(12) United States Patent
Parker et al.

(10) Patent No.: US 10,461,043 B1
(45) Date of Patent: Oct. 29, 2019

(54) METHOD OF MANUFACTURING AN ELECTROMAGNETIC SHIELD

(71) Applicant: Qorvo US, Inc., Greensboro, NC (US)

(72) Inventors: Stephen Craig Parker, Burlington, NC (US); James Edwin Culler, Jr., Lexington, NC (US); Donald Joseph Leahy, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/115,107

(22) Filed: Aug. 28, 2018

Related U.S. Application Data

(60) Provisional application No. 62/663,581, filed on Apr. 27, 2018.

(51) Int. Cl.
*H01L 23/552* (2006.01)
*H05K 9/00* (2006.01)
*H01L 21/56* (2006.01)
*H01L 23/31* (2006.01)

(52) U.S. Cl.
CPC ......... *H01L 23/552* (2013.01); *H05K 9/0088* (2013.01); *H01L 21/565* (2013.01); *H01L 23/3121* (2013.01)

(58) Field of Classification Search
CPC .......................... H01L 23/552; H01L 23/3121
See application file for complete search history.

(56) References Cited

U.S. PATENT DOCUMENTS 8,084,300 B1 * 12/2011 San Antonio ......... H01L 21/568
257/E21.602

OTHER PUBLICATIONS

Author Unknown, "EMI Shielding," Tango Systems Inc., Available online at: <<http://www.tangosystemsinc.com/markets/emi-shielding/>>, 2014, Accessed Dec. 6, 2018, 2 pages.

* cited by examiner

*Primary Examiner* — Moazzam Hossain
*Assistant Examiner* — Farun Lu
(74) *Attorney, Agent, or Firm* — Withrow & Terranova, P.L.L.C.

(57) ABSTRACT

The present disclosure provides electromagnetic shielding for integrated circuit (IC) modules. First, a precursor package with a number of IC modules is provided. The precursor package is then placed onto a chemical resistant tape. After a sweller process and a desmear process are performed, the chemical resistant tape is removed. Next, the precursor package is singulated to form a number of individual IC modules. The individual IC modules are placed onto a carrier tape, such that a bottom surface of each individual IC module is covered by the carrier tape, and a top surface and side surfaces of each individual IC module are exposed. A shielding structure is applied completely over the top surface and the side surfaces of each individual IC module. Herein, the shielding structure is electrically coupled to a ground plane within each individual IC module.

21 Claims, 9 Drawing Sheets

Figure 1:
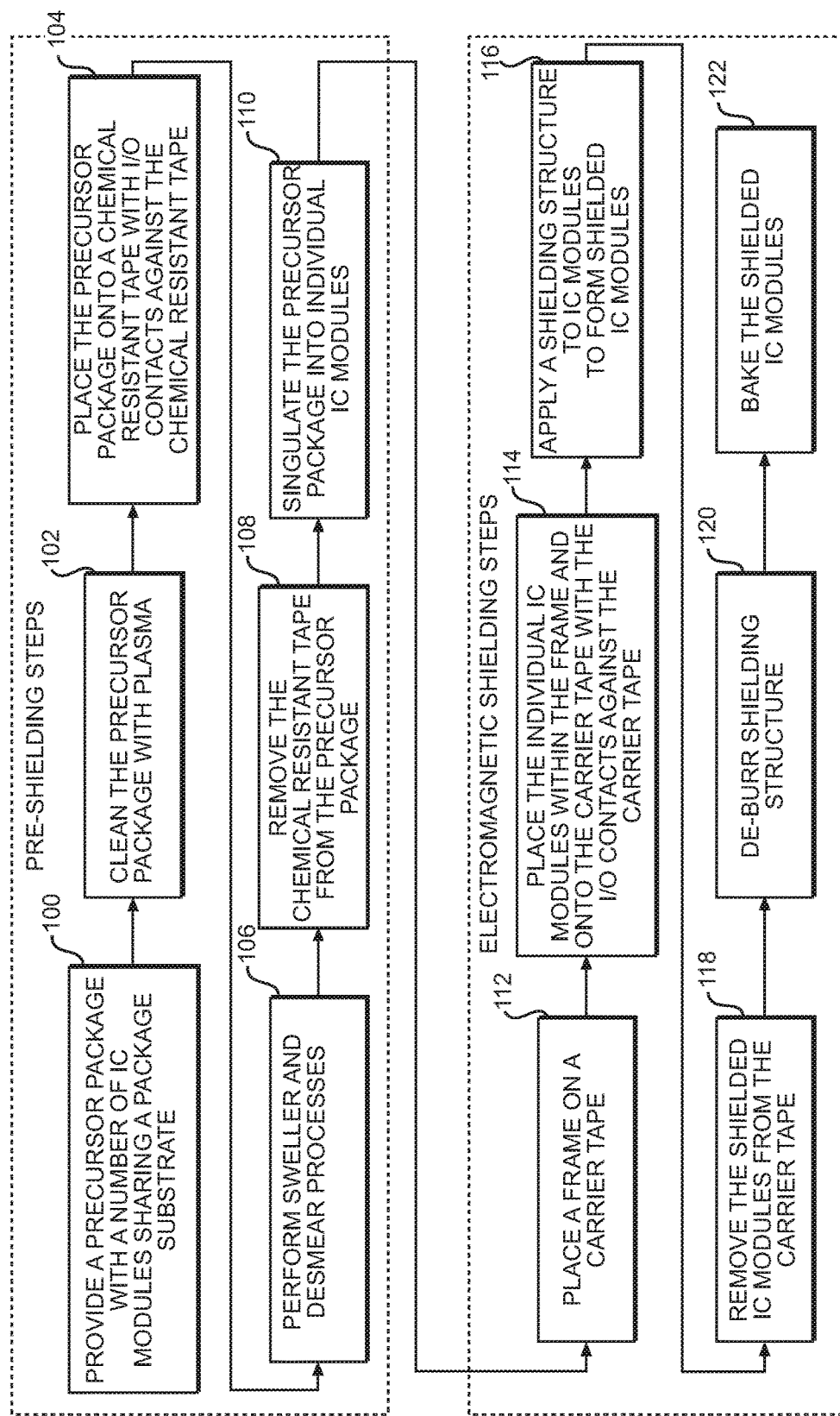

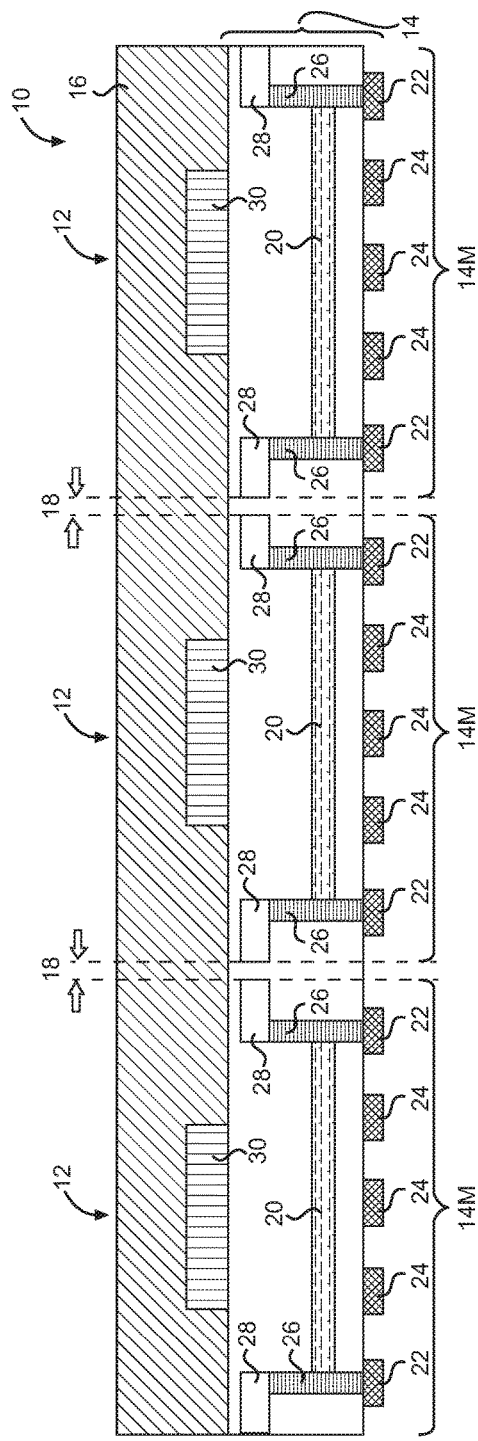
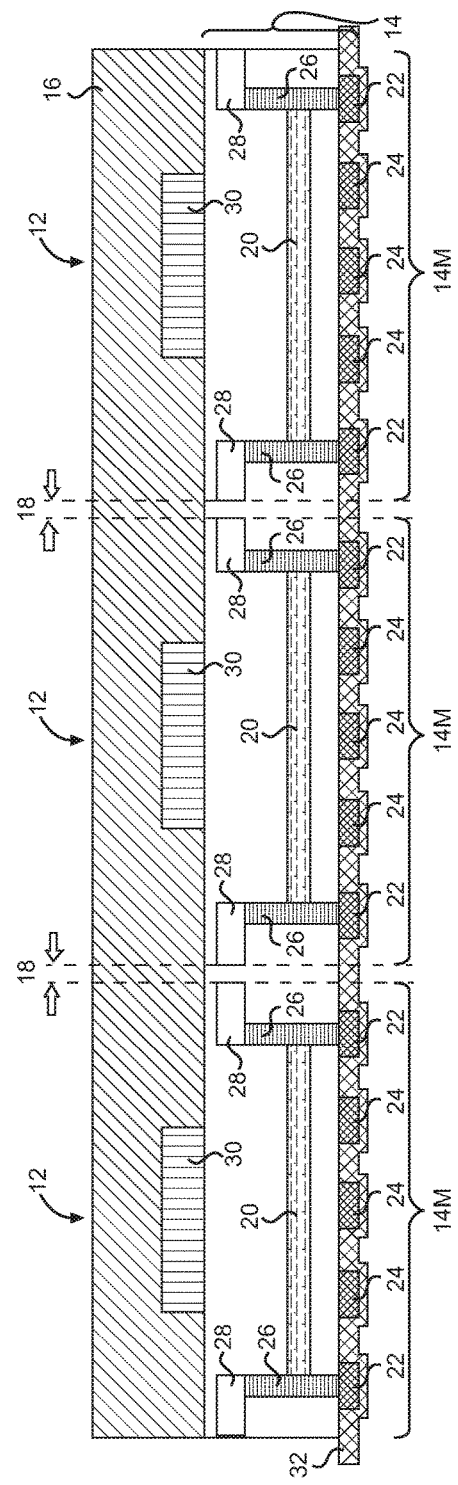
FIG. 2
FIG. 3

METHOD OF MANUFACTURING AN ELECTROMAGNETIC SHIELD

RELATED APPLICATIONS

This application claims the benefit of provisional patent application Ser. No. 62/663,581, filed Apr. 27, 2018, the disclosure of which is hereby incorporated herein by reference in its entirety.

FIELD OF THE DISCLOSURE

The present disclosure relates to a method of manufacturing an electromagnetic shield for integrated circuit modules.

BACKGROUND

Electronic components have become ubiquitous in modern society. The electronics industry proudly, but routinely, announces accelerated clocking speeds and smaller integrated circuit (IC) modules. While the benefits of these devices are myriad, smaller and faster electronic devices create problems. In particular, high clock speeds inherently require fast transitions between signal levels. Fast transitions between signal levels create electromagnetic emissions throughout the electromagnetic spectrum. Such emissions are regulated by the Federal Communications Commission (FCC) and other regulatory agencies. Furthermore, fast speed inherently means higher frequencies. Higher frequencies mean shorter wavelengths. Shorter wavelengths mean shorter conductive elements act as antennas to broadcast these electromagnetic emissions. These electromagnetic emissions radiate from a source and may impinge upon other electronic components. If the signal strength of the emission at the impinged upon electronic component is high enough, the emission may interfere with the operation of the impinged upon electronic component. This phenomenon is sometimes called electromagnetic interference (EMI) or crosstalk. Dealing with EMI and crosstalk is sometimes referred to as electromagnetic compatibility (EMC). Other components, such as transceiver modules, inherently have lots of radiating elements that raise EMI concerns. Thus, even electronic modules that do not have high clock speeds may have EMI issues.

One way to reduce EMI is to shield the IC modules that cause EMI or that are sensitive to EMI. Typically the shield is formed from a grounded conductive material that covers the top and at least a portion of the side of one circuit module. When electromagnetic emissions from the circuit module strike the interior surface of the conductive material, the electromagnetic emissions are electrically shorted through the grounded conductive material, thereby reducing emissions. Likewise, when emissions from another radiating element strike the exterior surface of the conductive material, a similar electrical short occurs, and the module does not suffer EMI from other modules.

However, if the shield fully covers the side of the circuit module, there is a high possibility that chemistries used in the shielding process may attack the input/output (I/O) contacts located at the bottom of the IC module. Alternatively, if the shield only partially covers the side of the circuit module, there are potential escape points for the electromagnetic field (EMF), which may result in decreased shield effectiveness. Thus, there is a need for an improved procedure that allows the shield to fully cover the side of the circuit module to effectively deal with EMI concerns, and does not impact the I/O contacts of the circuit module. In addition, cost effectiveness is desired.

SUMMARY

The present disclosure relates to a method of manufacturing an electromagnetic shield for integrated circuit (IC) modules. According to an exemplary procedure, a precursor package having a number of integrated circuit (IC) modules is first provided. Herein, an inter-module area is horizontally in between two adjacent IC modules. Each IC module includes a module substrate and at least one electronic component that is attached to a top surface of the module substrate and encapsulated by a mold compound. The module substrate includes a ground plane formed within the module substrate, and a number of first input/output (I/O) contacts formed at a bottom surface of the module substrate. Next, the precursor package is placed onto a chemical resistant tape, such that the first I/O contacts of each module substrate are sealed and against the chemical resistant tape. A sweller process followed by a desmear process are then performed on the precursor package, which resides over the chemical resistant tape. After the chemical resistant tape is removed from the precursor package and each first I/O contact is exposed, the precursor package is singulated at each inter-module area to form a number of individual IC modules. Each individual IC module includes the module substrate. Next, the individual IC modules are placed onto a top surface of a carrier tape, such that the first I/O contacts of each individual IC module are sealed and against the carrier tape. At last, a shielding structure is applied completely over a top surface and side surfaces of each individual IC module to form a number of shielded IC modules. The shielding structure is electrically coupled to the ground plane within the corresponding module substrate.

In one embodiment of the exemplary procedure, the chemical resistant tape completely covers the bottom surface of each module substrate.

In one embodiment of the exemplary procedure, the carrier tape completely covers the bottom surface of each module substrate.

In one embodiment of the exemplary procedure, the chemical resistant tape is configured to protect the bottom surface of each module substrate from chemical chemistries used in the sweller process and the desmear process. The carrier tape is configured to prevent leakage from the shielding structure onto the bottom surface of each module substrate.

In one embodiment of the exemplary procedure, the chemical resistant tape is pressure sensitive adhesive (PSA) tape or free standing adhesive. The carrier tape is formed from acrylic resin or silicone resin coated on a polymeric film.

In one embodiment of the exemplary procedure, applying the shielding structure includes applying a first layer and applying a second layer over the first layer. The first layer completely covers the top surface and the side surfaces of each individual IC module, such that the first layer is electrically coupled to the ground plane within the corresponding module substrate.

In one embodiment of the exemplary procedure, the first layer is formed by an electroless plating process and the second layer is formed by at least one of an electroless plating process and an electrolytic plating process.

In one embodiment of the exemplary procedure, the first layer is formed by an electroless plating process and an electrolytic plating process, and the second layer is formed by at least one of an electroless plating process and an electrolytic plating process.

In one embodiment of the exemplary procedure, the first layer is formed from one of copper, aluminum, silver, and gold, and the second layer is formed from nickel.

In one embodiment of the exemplary procedure, the bottom surface of the module substrate is not covered by the shielding structure.

In one embodiment of the exemplary procedure, each module substrate is formed from a common printed circuit board (PCB).

In one embodiment of the exemplary procedure, the module substrate further includes at least one conductive element electrically coupled to the ground plane. The at least one conductive element is positioned at a periphery of the module substrate and adjacent to an edge of a corresponding inter-module area, such that the at least one conductive element is exposed during singulating the precursor package at each inter-module area and in contact with the shielding structure.

In one embodiment of the exemplary procedure, the module substrate further includes a number of second I/O contacts formed at the bottom surface of the module substrate. Each first I/O contact is electrically coupled to the ground plane and electrically isolated from the second I/O contacts.

According to another embodiment, the exemplary procedure further includes cleaning the precursor package with plasma before placing the precursor package onto the chemical resistant tape.

According to another embodiment, the exemplary procedure further includes placing a frame on the top surface of the carrier tape before placing the individual IC modules onto the carrier tape, such that the individual IC modules are placed within the frame and onto a framed portion of the top surface of the carrier tape. Herein, the shielding structure is at least applied to the framed portion of the top surface of the carrier tape, such that the top surface and side surfaces of each individual IC module, which are exposed over the top surface of the carrier tape, are completely covered by the shielding structure.

According to another embodiment, the exemplary procedure further includes removing the shielded IC modules from the carrier tape.

According to another embodiment, the exemplary procedure further includes deburring the shielding structure of each shielded IC module.

According to another embodiment, the exemplary procedure further includes baking the shielded IC modules.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides a flow diagram that illustrates an exemplary process for manufacturing integrated circuit modules with an electromagnetic shield according to one embodiment of the present disclosure.

FIGS. 2-9 provide exemplary steps associated with the manufacturing process provided in FIG. 1.

It will be understood that for clear illustrations, FIGS. 1-9 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a method of manufacturing an electromagnetic shield for integrated circuit (IC) modules. FIG. 1 provides a flow diagram that illustrates an exemplary procedure for manufacturing IC modules with an electromagnetic shield according to one embodiment of the present disclosure. FIGS. 2-9 provide exemplary steps associated with the manufacturing procedure provided in FIG. 1. Although the exemplary steps are illustrated in a series, the exemplary steps are not necessarily order dependent. Some steps may be done in a different order than that presented. Further, procedures within the scope of this disclosure may include fewer or more steps than those illustrated in FIGS. 2-9.

Initially, a precursor package 10 with a number of integrated circuit (IC) modules 12 is provided as depicted in FIG. 2 (step 100). Typically, the precursor package 10 may include hundreds or thousands of IC modules 12. For the purpose of clarity and simplicity, FIG. 2 only illustrates three IC modules 12 sharing a package substrate 14 and a mold compound 16. Herein, the package substrate 14 may be a laminate, such as a printed circuit board (PCB), having a number of laminate layers (not shown). These laminate layers of the package substrate 14 may include prepreg material. The mold compound 16 resides over a top surface of the package substrate 14 and may be an organic epoxy resin system.

Further, the package substrate 14 may be divided into a number of module substrates 14M, and a number of inter-module areas 18. Each module substrate 14M corresponds to one IC module 12, and each inter-module area 18 has a small width and is horizontally in between adjacent module substrates 14M. Herein, each module substrate 14M includes a ground plane 20, a number of first input/output (I/O) contacts 22, a number of second I/O contacts 24, a number of via structures 26, and a number of conductive elements 28. The ground plane 20 is in an interior portion of the corresponding module substrate 14M. The ground plane 20 for each module substrate 14M may be formed from a common ground plane (not shown). The first I/O contacts 22 and the second I/O contacts 24 are formed at a bottom surface of the corresponding module substrate 14M, and do not reside underneath any inter-module area 18. The first I/O contacts 22 and the second I/O contacts 24 are conductive and may be metal pads formed by a land grid array (LGA) method. The first I/O contacts 22 are used for grounded signals and may be coupled to the ground plane 20 by the via structures 26. The second I/O contacts 24 are used for non-grounded signals and electrically isolated from the first I/O contacts 22. If the package substrate 14 is a PCB, there may be a solder mask (not shown) at the bottom surface of the package substrate 14. Each first/second I/O contact 22/24 may be formed from a copper pad with gold plating that is exposed through the solder mask. In addition, each conductive element 28 is positioned at a periphery of the module substrate 14M, such that each conductive element 28 is adjacent to an edge of one inter-module area 18 or exposed through a side surface of the package substrate 14. As used herein, the term "periphery" is defined to be the outermost part or region within a precise boundary, in particular, the boundary formed by the side surface of the module substrate 14M. The conductive elements 28 may be electrically coupled to the ground plane 20 by the via structures 26.

Besides the module substrate 14M, each IC module 12 also includes an electronic component 30 and a portion of the mold compound 16. The electronic component 30 is attached to a top surface of the corresponding module substrate 14M and does not reside on any inter-module area 18. The portion of the mold compound 16 resides over the top surface of the corresponding module substrate 14M and encapsulates the electronic component 30. In different applications, each integrated module 12 may include multiple electronic components. The electronic component 30 may be a flip-chip die, a wire-bonding die, a surface mounted device (SMD), an inductor, or other active/passive component.

In this embodiment, a top surface of the precursor package 10 is a top surface of the mold compound 16, a bottom surface of the precursor package 10 is a bottom surface of the package substrate 14, and side surfaces of the precursor package 10 are a combination of side surfaces of the mold compound 16 and side surfaces of the package substrate 14.

A cleaning process (step 102, not shown) is then utilized to clean the precursor package 10. Herein, the precursor package 10 may be cleaned with plasma. Next, the cleaned precursor package 10 is placed onto a chemical resistant tape 32 as depicted in FIG. 3 (step 104). In one embodiment, the chemical resistant tape 32 continuously and completely covers the bottom surface of the precursor package 10 (completely covers the bottom surface of each module substrate 14M and each inter-module area 18) and may not cover any portion of the side surface of the precursor package 10. As such, the first I/O contacts 22 and the second I/O contacts 24 of each IC module 12 are against and sealed by the chemical resistant tape 32. The chemical resistant tape 32, which may withstand various chemical chemistries, may be a solid tape, such as a pressure sensitive adhesive (PSA) tape, free standing adhesive (such as a gel), other adhesive coated films, or a film acting as an adhesive.

After the precursor package 10 is placed onto the chemical resistant tape 32, a sweller process and a desmear process are performed to the precursor package 10 (step 106, not shown). Herein, the sweller process is performed before the desmear process to soften the mold compound 16. The desmear process then employs relatively harsh chemical chemistries, such as permanganate, or other epoxy etching chemistries, such as reducing agents, acids, or oxidizing agents, to roughen the surfaces of the precursor package 10 for superior adhesion in the following shielding step. Since the chemical resistant tape 32 completely covers the bottom surface of the precursor package 10, the harsh chemical chemistries used in the desmear process will only affect the top surface and the side surfaces of the precursor package 10. As such, the first I/O contacts 22 and the second I/O contacts 24 on the bottom surface of the precursor package 10 are protected from potential damage by the harsh chemical chemistries.

Figure 4:
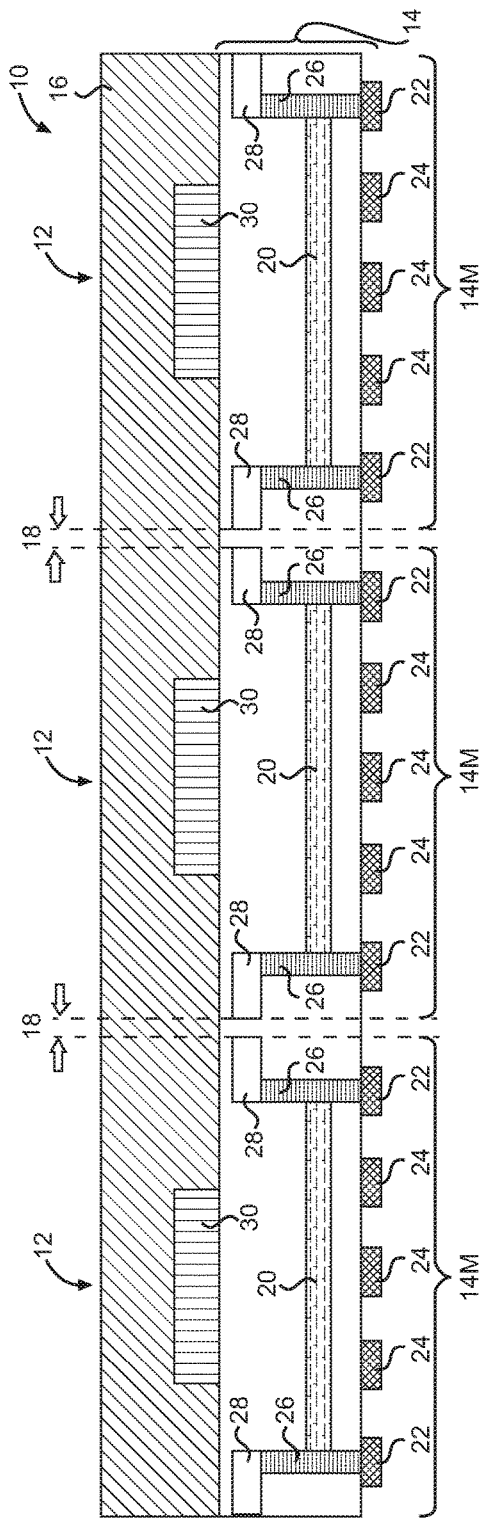
Figure 5:
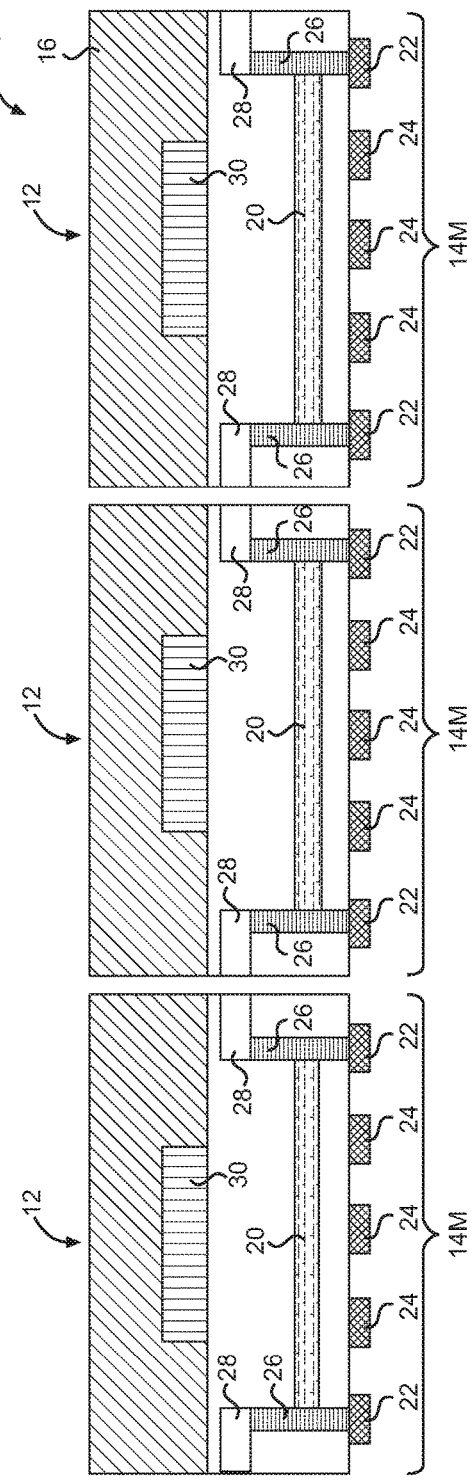

The chemical resistant tape 32 is then removed from the precursor package 10 to expose each first I/O contact 22 and each second I/O contact 24, as depicted in FIG. 4 (step 108). In one embodiment, the removing process may be provided by peeling the chemical resistant tape 32. Next, the precursor package 10 is singulated at each inter-module area 18 into individual IC modules 12, as depicted in FIG. 5 (step 110). The singulation of the precursor package 10 is achieved by removing a portion of the precursor package 10 at each inter-module area 18. Each removed portion of the precursor package 10 includes a portion of the package substrate 14 and a portion of the mold compound 16. Each removed portion of the precursor package 10 has a width that is wider than or equal to the width of the inter-module area 18, such that the conductive elements 28 adjacent to the edge of any inter-module area 18 are exposed through the side surface of the module substrate 14M. In addition, each removed portion of the precursor package 10 is not too wide to expose the first and/or the second I/O contact 22 and/or 24 that is close to the inter-module area 18.

Herein, a top surface of one individual IC module 12 is a top surface of a corresponding portion of the mold compound 16, a bottom surface of one individual IC module 12 is a bottom surface of a corresponding module substrate 14M, and side surfaces of one individual IC module 12 are a combination of side surfaces of the corresponding portion of mold compound 16 and side surfaces of the corresponding module substrate 14M.

Figure 6:
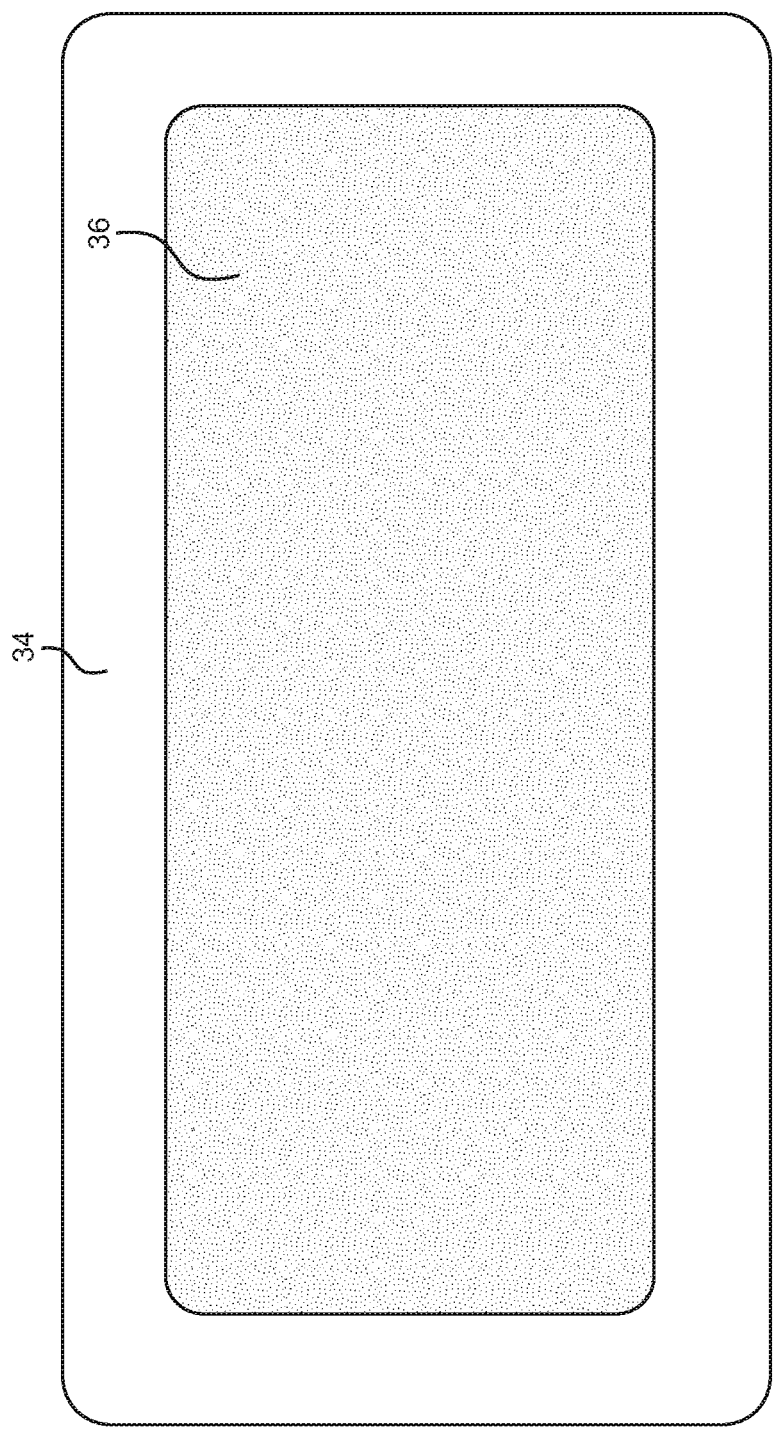

FIGS. 6-9 show electromagnetic shielding steps for the individual IC modules 12. The electromagnetic shielding steps begin by placing a frame 34 onto a top surface of the carrier tape 36, as depicted in FIG. 6 (step 112). An inner opening of the frame 34 may be smaller than the carrier tape 36, such that there is no void space within the frame 34. The frame 34 may be a stainless steel frame, and the carrier tape 36 may be formed from acrylic resin, silicone resin, or other polymeric materials coated on a polymeric film. Notice that the carrier tape 36 may have different mechanical and chemical properties from the chemical resistant tape 32. This is because the carrier tape 36 does not need to be exposed to the chemical chemistries employed by the sweller and desmear processes. As such, the carrier tape 36 may be relatively inexpensive in comparison to the chemical resistant tape 32. Various types of general purpose tapes may be used as the carrier tape 36.

Figure 7A:
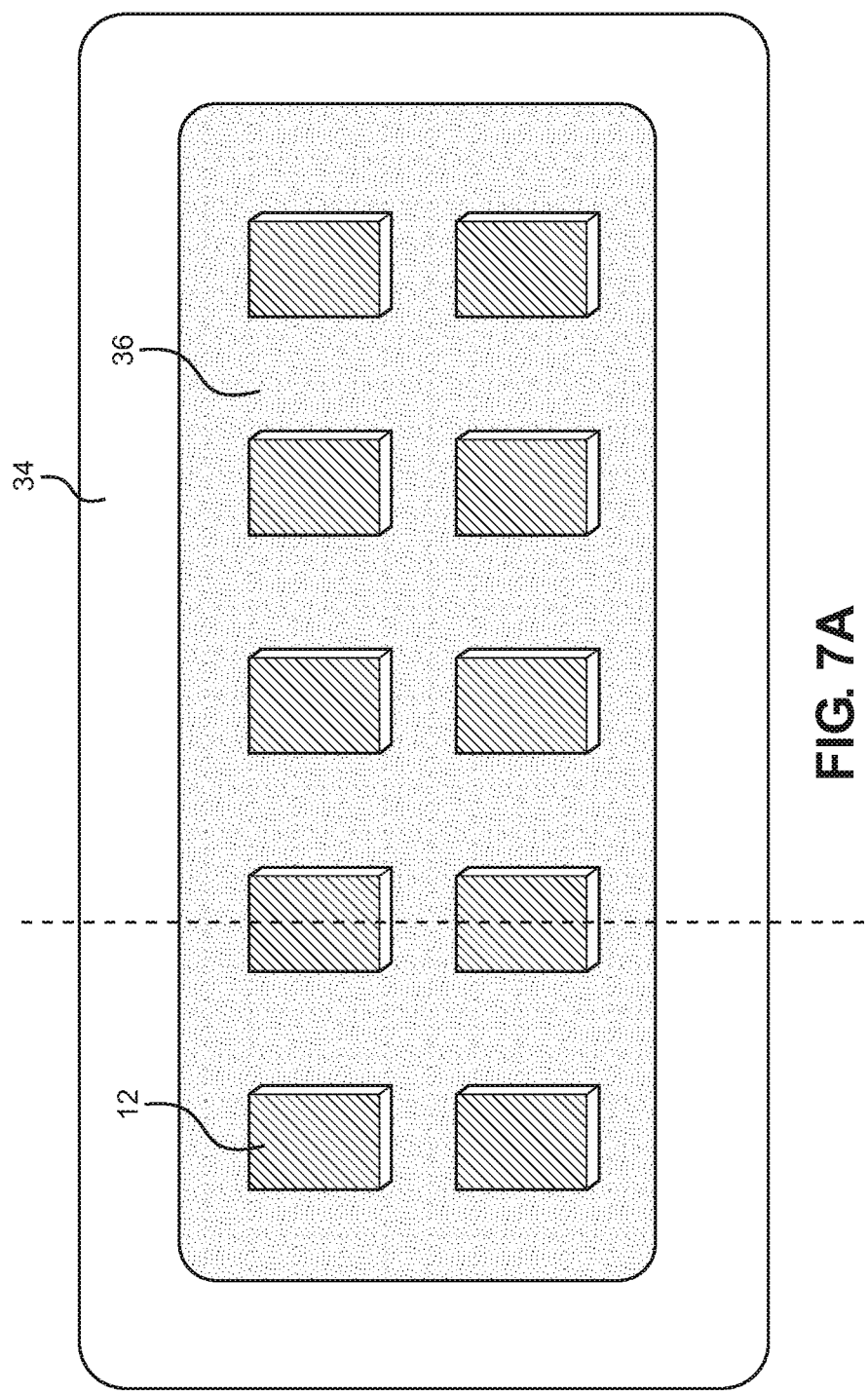
Figure 7B:
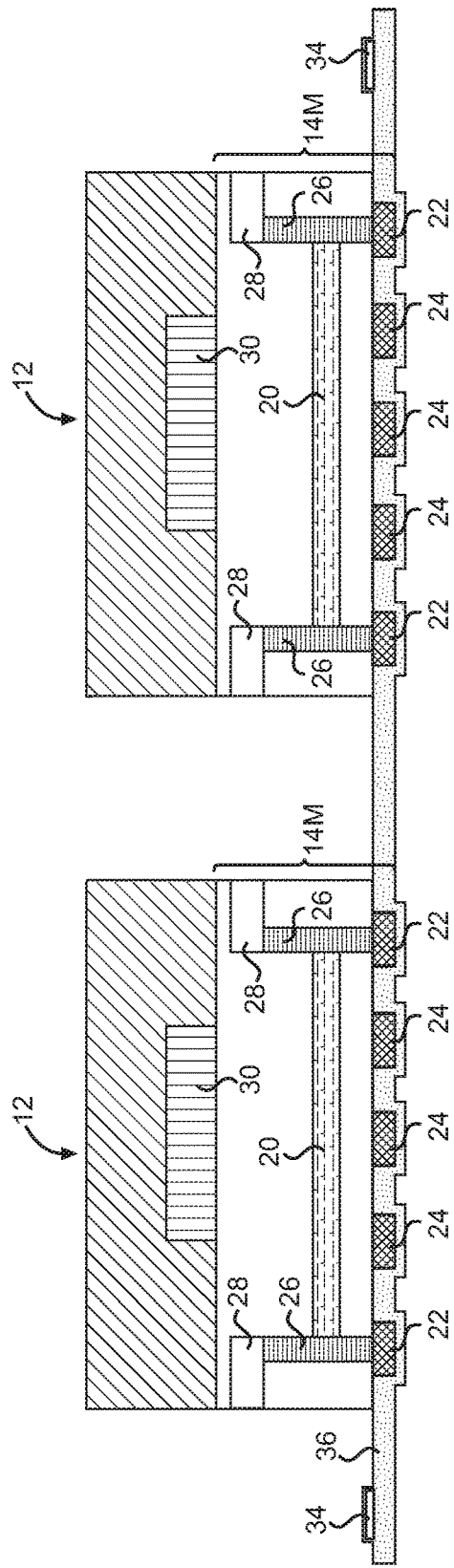

Next, the individual IC modules 12 are placed within the frame 34 and onto a framed portion of the top surface of the carrier tape 36, as depicted in FIGS. 7A and 7B (step 114). FIG. 7A shows a top view of the individual IC modules 12 over the carrier tape 36, and FIG. 7B shows a cross-section view of the individual IC modules 12 over the carrier tape 36 along a dashed-line in FIG. 7A. For the purpose of this illustration, there are ten individual IC modules 12 placed onto the framed portion of the top surface of the carrier tape 36 with a 2 by 5 configuration. In different applications, there may be fewer or more individual IC modules 12 with different configurations placed onto the framed portion of the top surface of the carrier tape 36. The carrier tape 36 is configured to hold/carry the individual IC modules 12 for the following shielding step. Herein, the carrier tape 36 completely covers the bottom surface of each individual IC module 12, but does not cover any portion of the side surfaces of each individual IC module 12. As such, the first I/O contacts 22 and the second I/O contacts 24 of each individual IC module 12 are against and sealed by the carrier tape 36, and the conductive elements 28 of each individual IC module 12 are exposed.

Figure 8A:
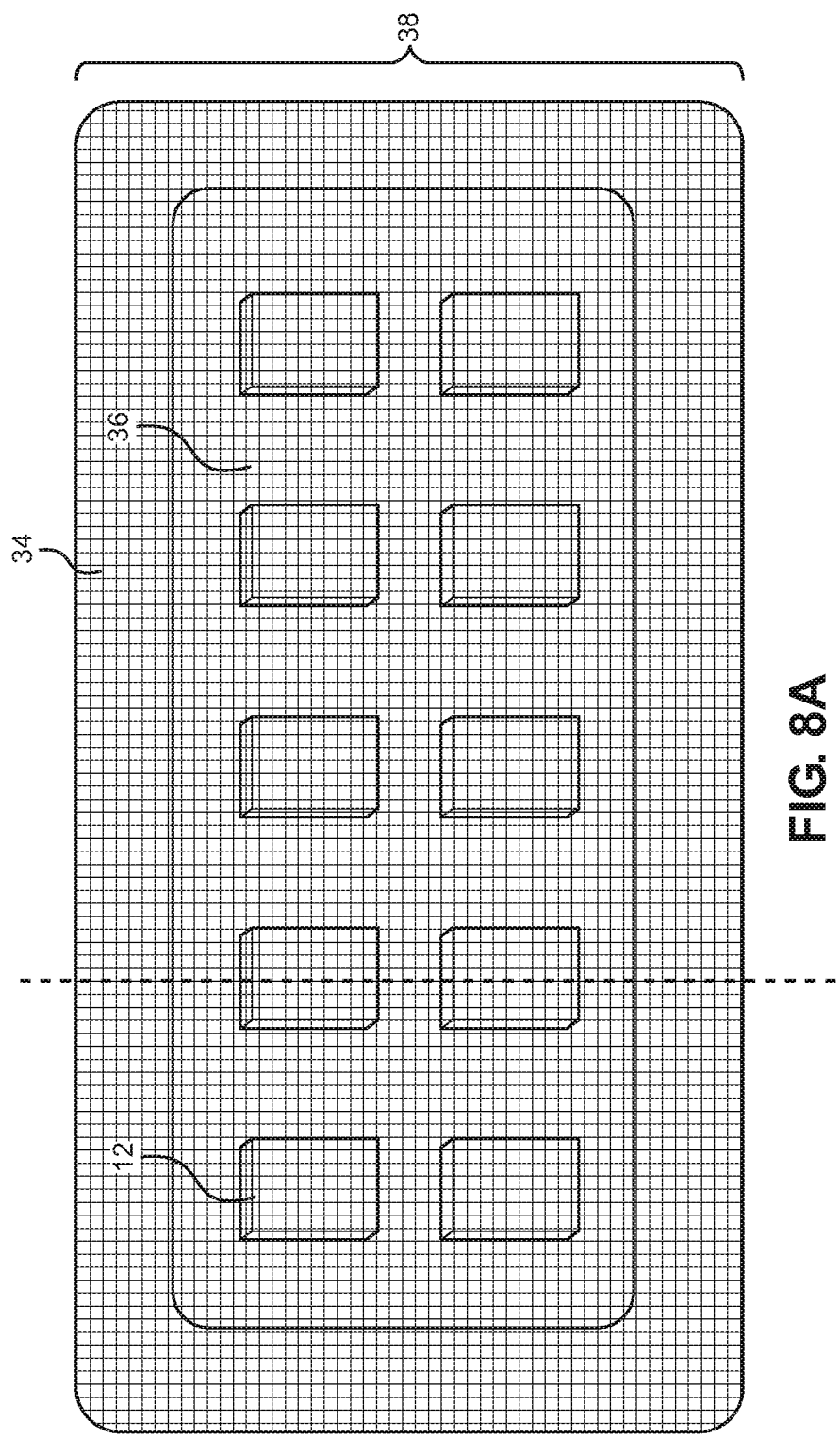
Figure 8B:
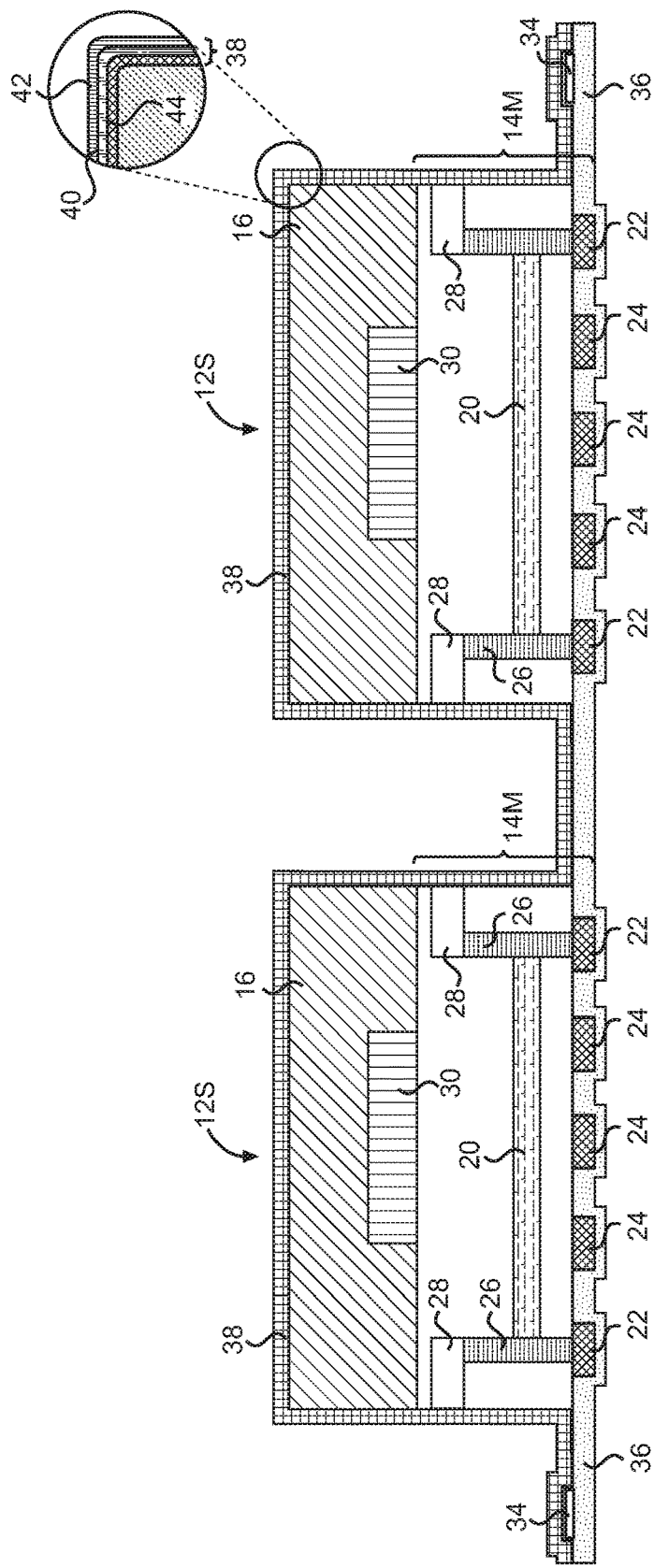

After the individual IC modules 12 are placed onto the carrier tape 36, a shielding structure 38 is applied to the individual IC modules 12 to form shielded IC modules 12S, as depicted in FIGS. 8A and 8B (step 116). FIG. 8A shows a top view of the shielded IC modules 12S over the carrier tape 36, and FIG. 8B shows a cross-section view of the shielded IC modules 12S over the carrier tape 36 along a dashed-line in FIG. 8A. In one embodiment, the shielding structure 38 is applied at least to the framed portion of the top surface of the carrier tape 36, such that the top surface and the side surfaces of each individual IC module 12, which are exposed over the top surface of the carrier tape 36, are completely covered by the shielding structure 38. Since each conductive element 28 is exposed through the side surfaces of the corresponding individual IC module 12, the shielding structure 38 is in direct contact with each conductive element 28. Consequently, the shielding structure 38 may be electrically coupled to the ground plane 20 through the conductive elements 28 and the via structures 26. In addition, since the bottom surface of each individual IC module 12 is completely covered by the carrier tape 36, the shielding structure 38 will not extend to the bottom surface of each individual IC module 12. It is clear that the carrier tape 36 is configured to prevent any leakage from the shielding structure 38 onto the bottom surface of each individual IC module 12. As such, the first I/O contacts 22 and the second I/O contacts 24 (especially the first/second I/O contacts 22/24 closest to the side surfaces of each individual IC module 12) will not be affected during the shielding step.

The shielding structure 38 includes at least a first layer 40 and a second layer 42. The first layer 40 may be applied at least to the framed portion of the top surface of the carrier tape 36, such that the top surface and the side surfaces of each individual IC module 12, which are exposed over the top surface of the carrier tape 36, are completely covered by the first layer 40. The first layer 40 may be formed from copper, aluminum, silver, gold, or other conductive materials and may have a thickness from 1 µm to 16 µm. In one embodiment, the first layer 38 may be formed by an electroless plating process. In another embodiment, the first layer 38 may be formed by an electroless plating process followed by an electrolytic plating process to achieve a desired thickness.

The second layer 42 resides over the first layer 40, and may be formed from nickel and may have a thickness from 0.5 µm to 5 µm. The second layer 40 may be formed by at least one of an electroless plating process and an electrolytic plating process. In order to achieve a better adhesion, the shielding structure 38 may further include a seed layer 44 formed from copper, aluminum, silver, gold, or other conductive materials and may have a thickness from 0.5 µm to 1.5 µm. The seed layer 44 may be applied at least to the framed portion of the top surface of the carrier tape 36, such that the top surface and the side surfaces of each individual IC module 12, which are exposed over the top surface of the carrier tape 36, are completely covered by the seed layer 44. The first layer 40 resides over the seed layer 44 and the second layer 42 resides over the first layer 40. The seed layer 44 may be formed by an electroless plating process.

Figure 9:
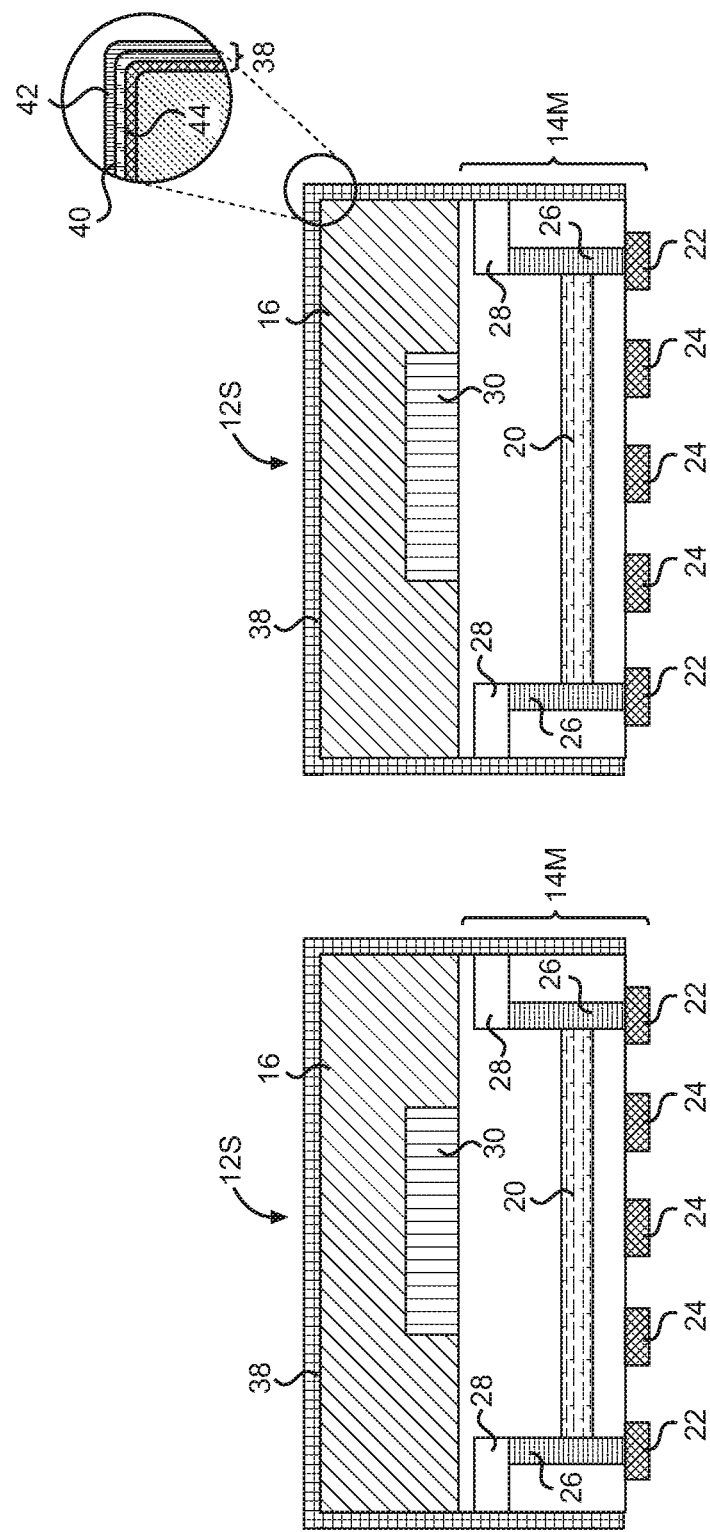

FIG. 9 shows that the shielded IC modules 12S are removed from the carrier tape 36 to expose the first I/O contacts 22 and the second I/O contacts 24 of each shielded IC module 12S (step 118). Herein, the shielding structure 38 still completely covers the top surface and side surfaces of each shielded IC module 12S, and remains electrically coupled to the ground plane 20. In some applications, a deburring process may applied to the shielding structure 38 to smooth surfaces of the shielded IC module 12S (step 120, not shown). Finally, the shielded IC module 12S is baked to enhance the adhesion of the shielding structure 38 to the individual IC modules 12 (step 122, not shown). In some applications, the deburring process may be omitted, and the baking step is followed by removing the shielded IC modules 12S from the carrier tape 36.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
providing a precursor package having a plurality of integrated circuit (IC) modules, wherein:
an inter-module area is horizontally in between two adjacent IC modules of the plurality of IC modules; and
each of the plurality of IC modules comprises a module substrate and at least one electronic component that is attached to a top surface of the module substrate and encapsulated by a mold compound, wherein the module substrate comprises a ground plane formed within the module substrate, and a plurality of first input/output (I/O) contacts formed at a bottom surface of the module substrate;
placing the precursor package onto a chemical resistant tape, such that the plurality of first I/O contacts of each module substrate are sealed and against the chemical resistant tape;
performing a sweller process on the precursor package, which resides over the chemical resistant tape;
performing a desmear process on the precursor package, which resides over the chemical resistant tape;
removing the chemical resistant tape to expose the plurality of first I/O contacts;
singulating the precursor package at each inter-module area to form a plurality of individual IC modules, each of which comprises the module substrate;
placing the individual IC modules onto a top surface of a carrier tape, such that the plurality of first I/O contacts of each individual IC module are sealed and against the carrier tape; and
applying a shielding structure completely over a top surface and side surfaces of each of the plurality of individual IC modules to form a plurality of shielded IC modules, wherein the shielding structure is electrically coupled to the ground plane within the corresponding module substrate.

2. The method of claim 1 wherein the chemical resistant tape completely covers the bottom surface of each module substrate.

3. The method of claim 1 wherein the carrier tape completely covers the bottom surface of each module substrate.

4. The method of claim 1 wherein:
the chemical resistant tape is configured to protect the bottom surface of each module substrate from chemical chemistries used in the sweller process and the desmear process; and
the carrier tape is configured to prevent leakage from the shielding structure onto the bottom surface of each module substrate.

5. The method of claim 4 wherein:
the chemical resistant tape is pressure sensitive adhesive (PSA) tape or free standing adhesive; and
the carrier tape is formed from acrylic resin or silicone resin coated on a polymeric film.

6. The method of claim 1 wherein applying the shielding structure comprises:
applying a first layer completely over the top surface and the side surfaces of each of the plurality of individual IC modules, wherein the first layer is electrically coupled to the ground plane within the corresponding module substrate; and
applying a second layer over the first layer.

7. The method of claim 6 wherein the first layer is formed by an electroless plating process and the second layer is formed by at least one of an electroless plating process and an electrolytic plating process.

8. The method of claim 6 wherein the first layer is formed by an electroless plating process and an electrolytic plating process, and the second layer is formed by at least one of the electroless plating process and the electrolytic plating process.

9. The method of claim 6 wherein:
the first layer is formed from one of a group consisting of copper, aluminum, silver, and gold; and
the second layer is formed from nickel.

10. The method of claim 1 wherein the bottom surface of each module substrate is not covered by the shielding structure.

11. The method of claim 1 wherein each module substrate is formed from a common printed circuit board (PCB).

12. The method of claim 1 wherein each module substrate further comprises at least one conductive element electrically coupled to the ground plane, wherein the at least one conductive element is positioned at a periphery of the module substrate and adjacent to an edge of a corresponding inter-module area, such that the at least one conductive element is exposed during singulating the precursor package at each inter-module area and in contact with the shielding structure.

13. The method of claim 1 wherein each module substrate further comprises a plurality of second I/O contacts formed at the bottom surface of the module substrate, wherein each of the plurality of first I/O contacts is electrically coupled to the ground plane and electrically isolated from the plurality of second I/O contacts.

14. The method of claim 1 further comprising cleaning the precursor package with plasma before placing the precursor package onto the chemical resistant tape.

15. The method of claim 1 further comprising placing a frame on the top surface of the carrier tape before placing the individual IC modules onto the carrier tape, such that the individual IC modules are placed within the frame and onto a framed portion of the top surface of the carrier tape.

16. The method of claim 15 wherein the shielding structure is at least applied to the framed portion of the top surface of the carrier tape, such that the top surface and the side surfaces of each of the plurality of individual IC modules, which are exposed over the top surface of the carrier tape, are completely covered by the shielding structure.

17. The method of claim 16 wherein applying the shielding structure comprises:
applying a first layer over at least the framed portion of the top surface of the carrier tape, such that the top surface and the side surfaces of each of the plurality of individual IC modules are completely covered by the first layer, wherein the first layer is electrically coupled to the ground plane within the corresponding module substrate; and
applying a second layer over the first layer.

18. The method of claim 1 further comprising removing the plurality of shielded IC modules from the carrier tape.

19. The method of claim 18 further comprising deburring the shielding structure of each of the plurality of shielded IC modules.

20. The method of claim 19 further comprising baking the plurality of shielded IC modules.

21. The method of claim 1 wherein the sweller process is performed before the desmear process.

* * * * *